US011210997B2

(12) United States Patent
Kaestle

(10) Patent No.: US 11,210,997 B2
(45) Date of Patent: Dec. 28, 2021

(54) PASSIVE MATRIX LED DISPLAY MODULE AND DISPLAY WITH SEVERAL PASSIVE MATRIX LED DISPLAY MODULES

(71) Applicant: OSRAM GmbH, Munich (DE)

(72) Inventor: Herbert Kaestle, Traunstein (DE)

(73) Assignee: OSRAM GMBH, Munich (DE)

( * ) Notice: Subject to any disclaimer, the term of this patent is extended or adjusted under 35 U.S.C. 154(b) by 0 days.

(21) Appl. No.: 16/973,913

(22) PCT Filed: Jun. 6, 2019

(86) PCT No.: PCT/EP2019/064867
§ 371 (c)(1),
(2) Date: Dec. 10, 2020

(87) PCT Pub. No.: WO2019/243077
PCT Pub. Date: Dec. 26, 2019

(65) Prior Publication Data
US 2021/0209999 A1   Jul. 8, 2021

(30) Foreign Application Priority Data

Jun. 22, 2018   (DE) .................... 10 2018 210 250.3

(51) Int. Cl.
*G09G 3/32*   (2016.01)
(52) U.S. Cl.
CPC ........... *G09G 3/32* (2013.01); *G09G 2300/06* (2013.01); *G09G 2330/028* (2013.01)

(58) Field of Classification Search
CPC . G09G 3/32; G09G 2300/06; G09G 2330/028
See application file for complete search history.

(56) References Cited

U.S. PATENT DOCUMENTS

| 10,777,114 B2* | 9/2020 | Moon ................... G09G 3/3266 |
| 2002/0183945 A1 | 12/2002 | Everitt |
| 2005/0052141 A1 | 3/2005 | Thielemans et al. |
| 2012/0293399 A1 | 11/2012 | Haskin |
| 2016/0321977 A1* | 11/2016 | Kong .................... G09G 3/2003 |
| 2016/0321980 A1* | 11/2016 | Matsumoto .......... G09G 3/3216 |

FOREIGN PATENT DOCUMENTS

CN   104091568 B   5/2016

* cited by examiner

*Primary Examiner* — Sejoon Ahn
(74) *Attorney, Agent, or Firm* — Slater Matsil, LLP

(57) ABSTRACT

In an embodiment a passive matrix LED display module includes n>1 first electrical lines connected to a respective first switch, m>1 second electrical lines connected to a respective second switch and at least m·n LED light sources, wherein each of the LED light sources is connected on an anode side to a first line and on a cathode side to a second line, wherein each of the first switches is a push-pull switch having a first terminal for connection to an LED supply voltage, a second terminal for connection to an adjustable discharge potential, a third terminal for receiving a switching signal and a fourth terminal for connection to an associated first line, wherein each of the second switches in a switched state is configured to allow current to flow to a reference potential, and wherein the second terminals of the push-pull switches are connected in common to an output voltage terminal of an adjustable voltage source.

11 Claims, 2 Drawing Sheets

PASSIVE MATRIX LED DISPLAY MODULE AND DISPLAY WITH SEVERAL PASSIVE MATRIX LED DISPLAY MODULES

This patent application is a national phase filing under section 371 of PCT/EP2019/064867, filed Jun. 6, 2019, which claims the priority of German patent application 102018210250.3, filed Jun. 22, 2018, each of which is incorporated herein by reference in its entirety.

TECHNICAL FIELD

The invention relates to a passive matrix LED display module. The invention further relates to a passive matrix LED display composed of several display modules.

BACKGROUND

Many passive matrix LED display modules (often also called "panels" or "tiles") of the respective type are typically switched during operation in such a way that the first lines (and thus also the LED light sources connected to them) are connected or applied to the LED supply voltage via a corresponding circuit or control of the first switches in their "active state" one after the other ("time-division multiplexed"). In their "inactive state", the first lines (and thus also the LED light sources connected to them) are each connected to a predetermined reference potential via a corresponding control of the first switches.

If the reference potential set by a second switch is lower than the LED supply voltage, those LED light sources which are currently connected to the LED supply voltage can be individually energized by the second switch and thus be individually stimulated to emit light. The switching of the LED supply voltage between the first lines is particularly periodic. One reason for the use of such time-division multiplexed control is that a passive matrix LED display module can thus be realized with a simple and compact connection technology and at the same time be equipped with comparatively inexpensive control electronics and driver electronics.

A disadvantage of such passive matrix LED display modules is that—due to parasitic capacitances of the first lines and of the LED light sources—parasitic currents can be generated in the first line, which is just separated from the LED supply voltage, when the LED supply voltage is switched between different first lines; on the basis of the parasitic currents even those LED light sources that are not specifically energized can light up for a short time. This leads to optical artifacts in the form of corresponding ghost images, which is also called "upper ghosting".

In addition, it is a disadvantage of such passive matrix LED display modules that when the LED supply voltage is switched on the first line, parasitic currents can retroactively occur in the LED light sources whose reference potential on the second line is set so that they should not light up selectively, due to parasitic capacitances of the LED light sources (so-called pn junction capacitances) via the inactive second lines. This also leads to optical artifacts in the form of ghost images, which are called "lower ghosting".

SUMMARY

Embodiments overcome the disadvantages of the prior art and in particular suppress an effect of generating ghost images.

Embodiments provide a passive matrix LED display module, comprising n>1 first electrical lines connected to a respective first switch, m>1 second electric line connected to a respective second switch, and at least n·m LED light sources, wherein each of the LED light sources is connected on an anode side to a first line and on a cathode side to a second line, wherein each of the first switches is configured as a push-pull switch having a first terminal for connection to an LED supply voltage, a second terminal for connection to an adjustable discharge potential, a third terminal ("switching input") for receiving a switching signal and a fourth terminal for connection to the associated first line, wherein each of the second switches in the switched state allows an adjustable current flow to a reference potential, and wherein the second terminals of the push-pull switches are connected in common to an output voltage terminal of an adjustable voltage source providing an adjustable discharge potential The fact that the second terminal of the push-pull switch is connected to the output voltage terminal of an adjustable voltage source providing an adjustable discharge potential allows the associated first line to be connected and held to this adjustable voltage potential or discharge potential during the time period when the first line is not connected to the LED supply voltage. This in turn allows the impedance of the at least one parasitic current path to be precisely adjusted so that the discharge rate of the parasitic line capacitance, which usually triggers the upper ghosting, becomes particularly high and the charge transfer rate, which usually causes the lower ghosting due to the retroactive capacitive coupling, becomes particularly low. In other words, by adjusting the output voltage of the adjustable voltage source (corresponding to an adjustable discharge potential), a bleeding impedance for discharging the parasitic capacitances can be adjusted to minimize ghosting of both ghosting effects. This, in turn, enables the passive matrix LED display to produce particularly high-contrast images with practically no edge artifacts (blurring or duplication).

If a first line is connected to an LED supply voltage due to an appropriate control or switching of the associated push-pull switch, and if the second line is connected to a reference potential or reference voltage that is lower than the LED supply voltage due to an appropriate setting of the reference potential, an operating current flows through the connected LED light source, exciting it to emit light with a specific intensity. For example, the LED supply voltage on the first line can be approximately 5 volts. The LED reference potential at the second line can be e.g. approximately 2.4 V to 1.3 V depending on the desired luminous intensity.

It is a further embodiment that the reference potential is adjustable at least between a first, lower reference potential and a second, higher reference potential, wherein the first reference potential results in a voltage level on the second line which is lower than the LED supply voltage and the second reference potential results in a voltage level on the second line which corresponds to the LED supply voltage. This allows the LED light source to be switched between an activated or illuminating state (corresponding to the first, lower level on the second line) and a deactivated state (corresponding to the second, higher level on the second line).

It is a further embodiment that the reference potential is variably adjustable, e.g. by having more than two adjustable potential values, especially quasi-continuously adjustable between the first potential value and the second potential value. This has the advantage that the operating current flowing through the at least one LED light source connected to it can be variably adjusted and thus the LED light source can be specifically dimmed.

It is a further embodiment that the second switch is configured as a resistor switch with adjustable resistance, which allows an adjustable current flow to a reference potential in the switched state. This also has the advantage that the operating current flowing through the at least one LED light source connected to it is variably adjustable and thus the LED light source can be selectively dimmed.

The second switch can be a general switching device with one or more components.

It is a further embodiment that the n first electrical lines run parallel and equally spaced to each other, especially in a horizontal direction. The number n is also known as "scan depth". In particular, the second electrical lines can run perpendicular to the first lines, e.g. vertically in a designated installation direction of the passive matrix LED display.

In particular, the m-n LED light sources can be arranged geometrically in a matrix-like pattern.

The first lines are each connected to an LED supply voltage via a push-pull switch so that there are n push-pull switches in total.

The adjustable discharge potential at the push-pull switches is provided in particular by an adjustable voltage source, especially a programmable voltage source.

In particular, each of the push-pull switches can be switched or adjusted by applying an appropriate first or second switching signal to its switching input, so that either the first terminal is electrically connected to the fourth terminal so that an electrical terminal of the LED supply voltage is connected to the corresponding first line or the LED supply voltage is applied to the first line, respectively, while the fourth terminal is electrically disconnected from the second terminal so that the electrical connection between the first line and the output voltage terminal of the adjustable voltage source (which provides the adjustable discharge potential) is interrupted; or the first terminal is electrically isolated from the fourth terminal so that the electrical connection of the LED supply voltage to the associated first line is interrupted, while the fourth terminal is electrically connected to the second terminal so that the electrical connection between the first line and the output voltage terminal of the adjustable voltage source is formed.

The push-pull switch can include one or more individual switching elements such as transistors etc. The push-pull switch can also be considered or called a push-pull switching stage.

It is an embodiment that the second terminal of the push-pull switches is connected on an anode side to a respective diode, and all diodes are connected on a cathode side to the output voltage terminal of the adjustable voltage source (and thus to the adjustable discharge potential).

This has the advantage that the diode inserted in the direction of current flow on the one hand enables the controlled discharge of the parasitic line capacitances to eliminate unwanted ghosting artifacts, but on the other hand prevents that with an adjusted output control voltage at the output voltage terminal of greater than 0 V in the passive phase no unwanted current can flow backwards through the push-pull switch and through the first line into the LED array. This diode can also be called a decoupling diode.

It is an embodiment that
the push-pull switch includes a p-channel field-effect transistor (also referred to as "p-FET") and an n-channel field-effect transistor (also referred to as "n-FET"),
a source terminal of the p-FET is connected to the LED supply voltage,
a drain terminal of the p-FET is connected to a drain terminal of the n-FET and to the corresponding first line,
a source terminal of the n-FET is connected to the output voltage terminal of the associated adjustable voltage source (adjustable discharge potential) and
the gate terminals of both field-effect transistors are connected together to a switching input of the push-pull switch.

The switching input thus forms a node with both gate terminals.

If a first switching signal is applied to the switching input of a push-pull switch, this first switching signal is applied to the gate terminals of both field-effect transistors accordingly. The first switching signal causes the source terminal and the drain terminal of the p-FET to be switched conductive with each other. This connects the LED supply voltage to the corresponding first line. The first switching signal, on the other hand, blocks the transition between the drain terminal and the source terminal of the n-FET, so that the electrical connection between this first line and the adjustable voltage source (adjustable discharge potential) is interrupted. The switching logic can also be inverted. The first switching signal can also be 0 Volt.

If a second switching signal (which can be 5 volts) is applied to the switching input of the push-pull switch, the electrical connection of the source terminal and the drain terminal of the p-FET—and thus also between the LED supply voltage and the corresponding first line—is interrupted. The second switching signal also causes an electrical connection between the drain terminal and the source terminal of the n-FET and thus also between the first line and the output voltage terminal of the variable or adjustable voltage source (adjustable discharge potential). This causes the first line to be at the voltage potential of the output voltage of the adjustable voltage source (corresponding to the adjustable discharge potential).

The source terminal of the n-channel field-effect transistor can be connected directly (i.e., without any intermediate electrical components) or indirectly via a diode (e.g. via the diode described above, to the output voltage terminal of the adjustable voltage source and thus to the adjustable discharge potential.

The field-effect transistors can be especially MOSFETs. In general other transistors can be used as field-effect transistors, e.g. bipolar transistors.

It is an embodiment that the switch inputs of the push-pull switches are connected to respective control outputs of a controller and another control terminal of the controller is connected to a control input of the adjustable voltage source. Via the control outputs of the controller the switching signals can be applied to the switching inputs of the respective push-pull switches.

Via the further control terminal a signal can be applied to the adjustable voltage source, by which the output voltage of the adjustable voltage source can be adjusted according to the adjustable discharge potential. This signal can be for example a PWM signal. This has the advantage that both the power supplies of the first lines and the output voltage of the adjustable voltage source can be controlled by the same component.

The controller can be an image processing controller, especially an image processing processor. The controller can be in particular a digital signal processor (DSP).

It is an embodiment that the second switches are integrated into a LED driver. The second switches can be configured e.g. as switching stages to apply the respective reference potential. The second lines are then especially connected to terminals of the LED driver, which are connected to the respective switching stages.

The LED driver can be connected to the controller via a data interface and be configured to receive instructions from the controller for switching the switching stages. This has the advantage that the push-pull switches and the switching steps can be switched precisely coordinated with each other in terms of timing, which allows for a very precise timing with activation and deactivation of the LED light sources.

It is a further embodiment that the LED driver is a current driver. The reference potentials applied to the second lines can then be passively built up. They adjust themselves at a cathode terminal of the LED light sources when the corresponding terminals of the LED driver are programmed to a certain current sink value. If, for example, 50 mA are programmed at a terminal of the LED driver, the corresponding reference potential at the output of the LED is set to approx. 2.5V at an LED supply voltage of 5V−U(LED(50 mA)). If e.g. 60 mA are programmed, then the reference potential at the output of the LED is set according to 5V−U(LED(60 mA))=approx. 2.3V, etc.

The data interface can be a serial interface or a parallel interface. The LED driver can be a constant current driver.

It is an embodiment that at least one LED light source has exactly one LED. The light-emitting diode can emit colored light (for example red, green or blue light) and/or emit white light.

It is an embodiment that at least one LED light source has several light-emitting diodes. The multiple light-emitting diodes can emit light of the same color or light of different colors. For example, the multiple light-emitting diodes can emit light of different colors, which is perceived by the human eye as mixed light. For example, the light-emitting diodes can emit red, green and blue light, which is mixed into a white mixed light.

It is a further embodiment that the controller drives the first lines in such a way that they are applied to the LED supply voltage one after the other ("time-multiplexed") (which can also be called "line scan"). Advantageously, this allows the LED light sources to be activated by a very easy to implement control.

It is an embodiment that the adjustable voltage source has at least one operational amplifier, one npn transistor and one pnp transistor (corresponding e.g. to a push-pull switching stage output), wherein a positive voltage input of the operational amplifier is connected to the control input of the adjustable voltage source or the adjustable discharge potential, wherein an output of the operational amplifier is connected to the base of the npn transistor and to the base of the pnp transistor, wherein the emitters of the npn transistor and the pnp transistor are connected to the output voltage terminal as well as to the negative voltage input of the operational amplifier, wherein a collector of the npn transistor is connected to a first, higher supply voltage and wherein a collector of the pnp transistor is connected to a second, lower supply voltage.

The advantage of using bipolar transistors is that they have very precise switching thresholds at their base.

It is an embodiment that an RC smoothing element is connected between the control input and the positive voltage input and a control signal received at the control input is a PWM signal.

In general, a display module as described above can have one or more LED fields or LED arrays, each with (m-n) LEDs. It is a further embodiment that each LED field has LEDs of the same light color as LED light sources. At least two, especially three or more, different LED arrays can have LEDs of different light color.

It is a further embodiment that LEDs of different LED fields, which are located at the same (matrix) positions, are arranged so close together that they form a common pixel of the display module. The light emitted by such a group of LEDs is perceived as the summed mixed light of the corresponding pixel. In particular, at least two, especially three or more, LEDs of a group can have a different light color or emit light of different colors, so that the summed mixed light has a sum color location that can be adjusted depending on the respective brightness of the LEDs. It is particularly advantageous if the summed mixed light can have a sum color location that corresponds to white light.

In a further embodiment the LEDs of a group can have a red, green or blue light color. One or more LEDs can be present for each individual light color in a group. However, the light color is not limited to an RGB triplet, but can also have other light colors like amber, orange etc. Also, as an alternative to RGB color mixing, another color mixing can be used, which is preferably also adjustable to a white sum color location, for example a light mixing according to the so-called "Brilliant Mix" from the Osram company, which includes at least the light colors "greenish-white" and amber.

In the case of several LED arrays, the associated electronics including the first and second switches for each LED array can be present accordingly. The LED fields can thus be controlled and set up completely independently of each other. Alternatively, at least one or more components of the display module can be used together for several LED arrays. For example, the LEDs of a group can be connected to a common first line, but assigned to different second switches. Alternatively, the LEDs of a group can be connected to different first lines and different switches, wherein the first lines can be switched or activated by the same push-pull switches and/or the same controllers.

The display module described above works especially layout-wise and electronically self-sufficient. Also, image data can be serially fed to the current drivers internally in a self-sufficient way.

The display modules have mechanically sharply ground edges in a further embodiment, so that they can be assembled seamlessly ("seamless-free") next to each other to build a panel or display.

The connectors for power and data of the display modules can, for example, extend to the back or rear.

Embodiments also provide a passive matrix LED display, which has several modules as described above. In particular, the modules can be arranged seamlessly next to each other.

BRIEF DESCRIPTION OF THE DRAWINGS

The characteristics, features and advantages of this invention described above and the way in which they are achieved become clearer and more understandable in connection with the following schematic description of an example of embodiment, which is explained in more detail in connection with the drawings. For the sake of clarity, identical or similarly acting elements may be provided with identical reference signs.

DETAILED DESCRIPTION OF ILLUSTRATIVE EMBODIMENTS

Figure 1:
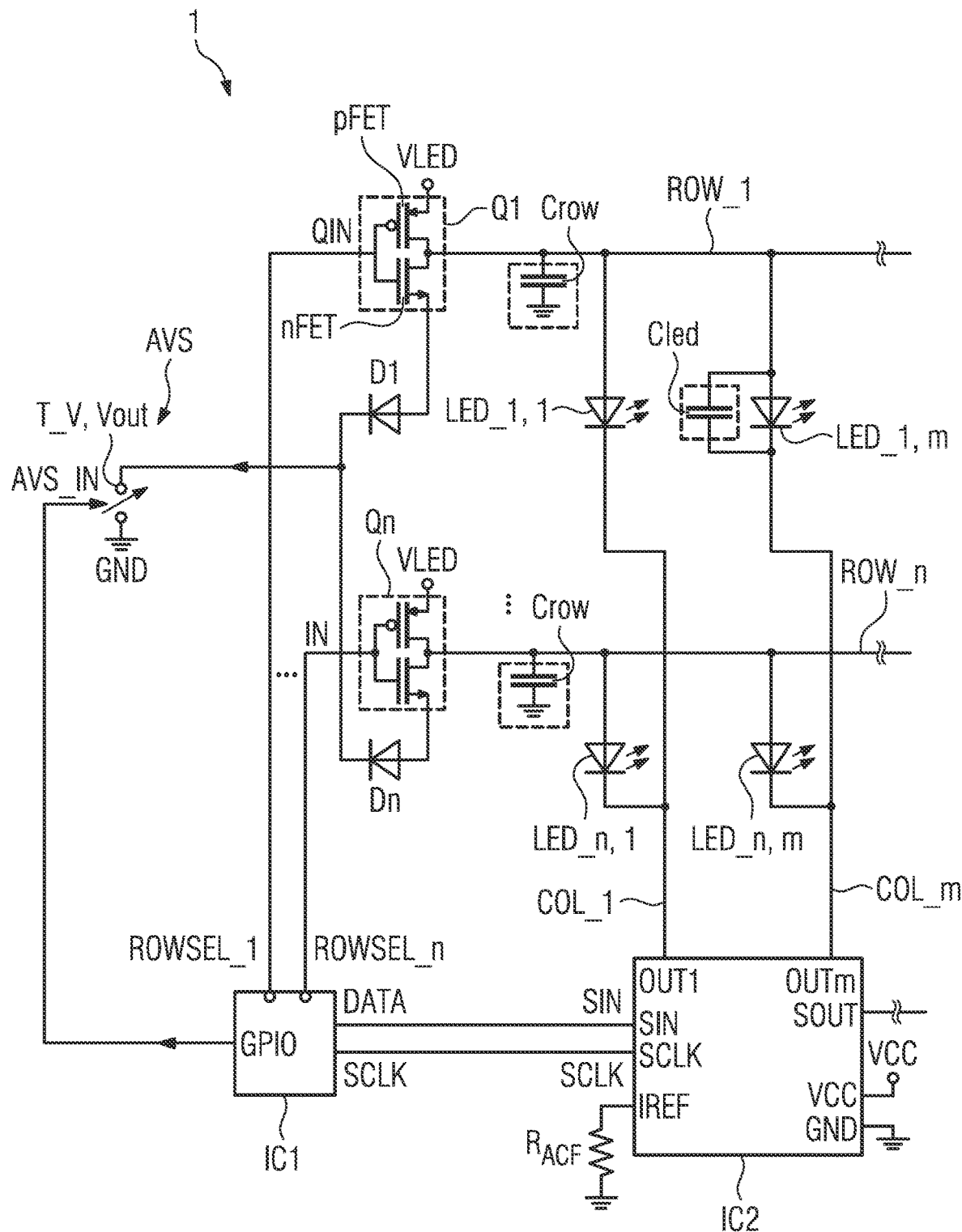
FIG. 1 shows a possible circuit diagram of a display module of a passive matrix LED display.

FIG. 1 shows a possible circuit diagram of a display module 1 of a passive matrix LED display 1. The display module 1 can be a so-called "tile" of the passive matrix LED display 1, which can display e.g. m×n=16×16 pixels m×n=48×64 pixels etc. The display built up from many display modules 1 can, for example, implement a video wall. The display can be especially a high resolution display, for example a 4K display, but is not limited to that.

The display module 1 includes n with n>1 first electrical lines ROW_i with i=1, . . . , n, which are arranged parallel and equally spaced to each other and are drawn here as horizontal lines. The first lines ROW_i can, for example, consist of a translucent, electrically conductive material.

The number n of the first lines ROW_i is basically arbitrary, wherein only the first lines ROW_1 and ROW_n are drawn here. For example, n can be 16 or 48. Each of the first lines ROW_i has a parasitic capacitance, which is drawn here as equivalent capacitance Crow.

Each of the first lines ROW_i can be connected to a LED supply voltage VLED via a corresponding push-pull switch Qi with i=1, . . . , n. The LED supply voltage can be e.g. 5 Volt.

The display module 1 also includes m>1 second electrical lines COL_j with j=1, . . . , m, which are arranged parallel and equidistant to each other and are drawn here as vertical lines. The number m of the second lines COL_j is also basically arbitrary, but for practical reasons is limited by the number of second switches to be programmed in series. For example, m=16 or m=48 may apply.

Each of the first lines ROW_i is connected to each of the second lines COL_j via at least one light-emitting diode LED_i,j; wherein an anode side of the light-emitting diode LED_i,j is connected to the ith first line ROW_i and a cathode side of the LED light source LED_i,j is connected to the corresponding second line COL_J. Thus, the LED light sources here each comprise a light-emitting diode LED_i,j as an example. Each of the light-emitting diodes LED_i,j has a parasitic capacitance, which is shown here as the equivalent capacitance Cled for the LED_1,m.

The light-emitting diodes LED_i,j are especially arranged in a matrix. In particular, a light-emitting diode LED_i,j can belong to a specific pixel of the passive matrix LED display module 1.

The second lines COL_1 to COL_m are connected to respective terminals OUT1 to OUTm of an LED driver IC2, which serve as adjustable current sink or current sink terminals. The terminals OUT1 to OUTm are connected to respective second switches in the form of switching stages (not shown) of the LED driver IC2. By appropriately programming a current sink value at the terminals OUT_1 to OUTm, the respective desired reference potentials can be indirectly set or defined at the second lines COL_1 to COL_m. If an light-emitting diode LED_i,j is selectively not to be energized, the reference potential is set so that a voltage corresponding to the LED supply voltage is formed on the second line COL_j associated with this light-emitting diode LED_i,j.

Each of the push-pull switches Qi includes a p-channel field-effect transistor pFET and an n-channel field-effect transistor nFET, wherein a source terminal of the p-channel field-effect transistor pFET is connected to the LED supply voltage VLED, a drain terminal of the p-channel field-effect transistor pFET is connected to a drain terminal of the n-channel field-effect transistor nFET and to the associated first line ROW_i and the gate terminals of both field-effect transistors pFET, nFET are connected to each other to form a switching input QIN of the push-pull switch Qi. A source terminal of the n-channel field-effect transistor nFET is connected to an anode side of a respective diode Di (i=1, . . . , n), and the cathode sides of all diodes Di are jointly connected to an output voltage terminal T_V of an adjustable voltage source AVS.

The control terminals QIN of the push-pull switches Qi are connected to the respective control outputs ROWSEL_i with i=1, . . . , n of a controller IC1, only the control outputs ROWSEL_1 and ROWSEL_n are shown. Via the control outputs ROWSEL_i the controller IC1 can output corresponding control signals for switching the push-pull switches Qi to the control terminals QIN.

The controller IC1 also includes a control terminal GPIO which is connected to a control input AVS_IN of the adjustable voltage source AVS.

The controller IC1 can adjust the output voltage Vout applied to an output voltage terminal T_V of the adjustable voltage source AVS by an appropriate control signal at the control terminal GPIO. The output voltage Vout can be e.g. 2.3 volts below the LED supply voltage. The output voltage Vout of the adjustable voltage source can be adjusted by a corresponding PWM control signal at the GPIO output of the controller IC1 which is connected to the control input of the adjustable voltage source. The output voltage Vout can be e.g. 2.3 volts below the LED supply voltage.

The microcontroller IC1 is also configured to inform the LED driver IC2 which second line(s) COL_j is/are to be applied to which reference potential at which time or for which duration. For this purpose a serial data interface is used here as an example, which comprises a data connection and a clock line (e.g. in the MHz range).

To activate the light-emitting diodes LED_i,j, in particular, a certain push-pull switch Qi can be switched so that the LED supply voltage VLED is only applied to one of the first lines ROW_i. By appropriately switching the switching stages of the LED driver IC2, the light-emitting diodes LED_i,j connected to this first line ROW_i can be activated one after the other or simultaneously. It is also possible not to activate one or more light-emitting diodes LED_i,j. In general, by adjusting the level of the corresponding reference potential it is also possible to individually adjust the current flowing through a particular light-emitting diode LED_i,j so that the light-emitting diode LED_i,j only lights up dimmed.

Subsequently, the LED supply voltage VLED is separated from this first line ROW_i and applied to another first line ROW_k and the process is repeated for the other first line ROW_k. In the course of this switching of the LED supply voltage VLED from the first line ROW_i to the other first line ROW_k, two ghosting effects can occur, which are called "upper ghosting" and "lower ghosting".

The upper ghosting effect is based on the fact that a parasitic current is generated in the first line ROW_i by the parasitic capacitance Crow of the first line ROW_i as such and possibly by the parasitic capacitances Cled of the light-emitting diodes LED_i,j connected to this first line ROW_i. This parasitic current is conducted via that light-emitting diode LED_i,j which is connected to the first line ROW_i and to that second line COL_j and which is currently already supplied again with a lower reference potential.

This is explained in more detail in the following using the arrangement shown in FIG. 1 as an example:

It can be assumed that the LED supply voltage VLED has been disconnected from the (first) first line ROW_1 and connected to the (nth) first line ROW_n by correspondingly different switching of the push-pull switches Q1 and Qn. Furthermore, it is assumed that the second line COL_1 is connected to a lower reference potential (i.e., a reference potential lower than the LED supply voltage VLED), so that the light-emitting diode LED_n,1 selectively emits light. The reference potential of the other light-emitting diode LED_n,m is selected so that no operating current flows through it. This can be achieved, for example, by ensuring that the reference potential of the other light-emitting diode LED_n,m corresponds to the level of the LED supply voltage VLED, or by separating the second line COL_m from the reference potential or setting it to a reference potential of 5V or a current sink value of 0 mA.

If a simple switch (e.g. a transistor) for optionally connecting and disconnecting the LED supply voltage VLED from the first line ROW_1 were present (not shown) instead of the push-pull switch Q1 with adjustable voltage supply AVS, the parasitic current generated by the parasitic capacitance(s) Crow, Cled in the first line ROW_1 would flow through the light-emitting diode LED_1,1 and the second line COL_1. The corresponding light-emitting diode LED_1,1 would thus no longer light up weakly when the LED supply voltage VLED is switched and the upper ghosting effect would be suppressed.

If, instead of the push-pull switch Q1 with adjustable voltage supply AVS, a push-pull switch Q1 connected only to ground as the discharge potential is present, this parasitic current from the first line ROW_1 could flow partially through the n-FET nFET of the push-pull switch Q1, thus weakening the upper ghosting effect.

The lower ghosting effect is also explained in more detail below using the arrangement shown in FIG. 1 as an example:

It is further assumed that the LED supply voltage VLED has been disconnected from the first line ROW_1 and connected to the first line ROW_n by corresponding switching of the push-pull switches Q1 and Qn. Furthermore, it is assumed that the second line COL_1 is connected to a reference potential which is lower than the LED supply voltage, so that the light-emitting diode LED_n,1 selectively emits light.

The lower ghosting effect is produced by the fact that due to the intrinsic, parasitic capacitance Cled of the light-emitting diode LED_1,m, a parasitic current can flow from the activated first line ROW_n, through the light-emitting diode LED_n,m and via the second line COL_m in the reverse direction through the light-emitting diode LED_1,m, through the first line ROW_1, through the push-pull switch Q1 to the discharge potential. The current flow will be maintained until the capacity Cled of the light-emitting diode LED_1,m is charged, or an appreciably high current is programmed through the light-emitting diode LED_1,m.

The strength of the parasitic current flow to produce the lower ghosting effect also depends on the level of the discharge potential: the lower the discharge potential, the higher the parasitic current flow through the push-pull switch Q1 and the stronger the lower ghosting effect.

The setting of the discharge potential must therefore meet two opposing target requirements, namely a reduction of the upper ghosting effect and a reduction of the lower ghosting effect.

The voltage still present in the first line ROW_1 after switching over the LED supply voltage VLED can so far basically be determined by the fact that instead of the diode Di and the adjustable discharge potential there is a Zener diode or Z-diode which is connected with its cathode side—possibly via a resistor—to the source terminal of the n-FET nFET of the respective push-pull switch Qi and with its anode side to ground. The breakdown voltage of the Z-diode then functionally corresponds to the output voltage Vout.

However, when using a Z-diode, it is a disadvantage that component and manufacturing tolerances of the Z-diode do not allow for an optimal adjustment afterwards. In particular, Z-diodes are known to be imprecise at nominal forward voltages below approx. 5 volts. Therefore, it is likely that the actual breakdown voltage of a Z-Diode does not correspond to the value that achieves a desired ratio between the upper ghosting effect and the lower ghosting effect. This is particularly disadvantageous because the strengths of these two ghosting effects are sensitive to the value of the breakdown voltage.

In contrast, the passive matrix LED display module 1 described above, by using the adjustable voltage source AVS instead of a Z-diode, has the advantage that the strengths of the Upper Ghosting Effect and the Lower Ghosting Effect can be precisely adjusted by adjusting the output voltage Vout of the adjustable voltage source AVS, thus producing particularly high-contrast images. This is also possible after the display has been assembled as part of a commissioning procedure.

The strength of the parasitic current flow through the push-pull switch Q1 depends on the level of the discharge potential corresponding to the output voltage Vout of the adjustable voltage source AVS: the higher the discharge potential provided by the adjustable voltage source, the lower the parasitic current flow through the push-pull switch Q1 and the stronger the upper ghosting effect.

For example, the following components can be used: as push-pull switch Qi a component of type IRF7307 from International Rectifier/Infineon; as diodes Di small-signal diodes of type 1N4148 from NXP Semiconductors; as microcontroller IC1 a microcontroller of type ARM-Cortex-M4 MCU STM32F4 from STMicroelectronics; and as LED driver IC2 a LED driver of type TLC59283 from Texas Instruments.

Figure 2:
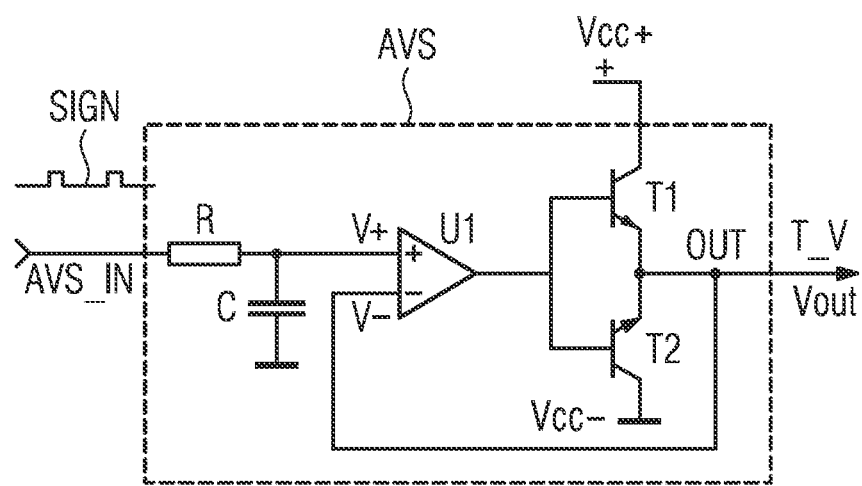
FIG. 2 shows a possible embodiment of an adjustable voltage source of the display module of a passive matrix LED display.

FIG. 2 shows—using a circuit diagram—a possible embodiment of the adjustable voltage source AVS which provides an adjustable discharge potential. The control input AVS_IN is coupled to an RC element R, C, which consists of an ohmic resistor R and a capacitor C. The RC element R, C can be used as a smoothing element, for example. The other side of the capacitor C is connected to ground. The capacitor C of the RC element is connected to ground, but it could also be connected to another predetermined reference potential like VLED. The output of the RC element R, C is connected to the positive signal input V+ of an operational amplifier U1. The operational amplifier U1 is shown here without its supply terminals.

An output of the operational amplifier U1 is connected to a base of an npn transistor T1 and to a base of a pnp transistor T2. The bases of the two transistors T1, T2 are connected together. Especially here the collector of the npn transistor T1 is connected to a supply voltage Vcc+ and the emitter of the npn transistor T1 is connected to an emitter of the pnp transistor T2. The collector of the pnp transistor T2 is connected to a supply voltage Vcc− (e.g. ground) which is lower than the supply voltage Vcc+. For example, if the collector of the npn transistor T1 is connected to Vcc+=5 V, then the collector of the pnp transistor T2 is connected to Vcc−=ground.

The two emitters are connected to the output voltage terminal T_V as well as to the negative voltage input V− of the operational amplifier U1. The two transistors T1, T2 are thus connected to each other in the manner of a push-pull amplifier.

If a control signal SIGN is output from the control terminal GPIO of the controller IC1 to the control input AVS_IN of the adjustable voltage source AVS, e.g. as indicated here in the form of a PWM signal, the control signal SIGN is first smoothed by the RC element R, C and then represented as a voltage signal at the output by the operational amplifier U1, which is then transferred on unchanged in voltage value but with a high current carrying capacity via the push-pull stage T1, T2.

The level of the output voltage Vout is determined by the PWM duty cycle set by the controller IC. By varying the PWM duty cycle, the level of the output voltage Vout can be precisely adjusted.

Although the invention has been illustrated and described in detail by the example shown, the invention is not limited to this and other variations can be derived by an expert without leaving the scope of protection of the invention.

Thus, the display module may also have several LED fields with (m×n) light-emitting diodes LED_i,j with different light colors.

In general, "a", "one" etc. can be understood as a singular or plural number, especially in the sense of "at least one" or "one or more" etc., as long as this is not explicitly excluded, e.g. by the expression "exactly one" etc.

Also a number can contain exactly the given number as well as a usual range of tolerance, as long as this is not explicitly excluded.

The invention claimed is:

1. A passive matrix LED display module comprising:
   a number n of first electrical lines connected to a respective first switch, where the number n>1;
   a number m of second electrical lines connected to a respective second switch, where the number m>1; and
   at least m times n LED light sources,
   wherein each of the LED light sources is connected on an anode side to a line of the number n of first electrical lines and on a cathode side to a line of the number m of second electrical lines,
   wherein each of the first switches is a push-pull switch having a first terminal for connection to an LED supply voltage, a second terminal for connection to an adjustable discharge potential, a third terminal for receiving a switching signal and a fourth terminal for connection to the line of the number n of first electrical lines,
   wherein each of the second switches in a switched state is configured to allow current to flow to a reference potential, and
   wherein the second terminals of the push-pull switches are connected in common to an output voltage terminal of an adjustable voltage source.

2. The passive matrix LED display module according to claim 1, wherein each second terminal of each push-pull switch is connected on an anode side to a respective diode, and wherein all diodes are connected on a cathode side to the output voltage terminal of the adjustable voltage source.

3. The passive matrix LED display module according to claim 1,
   wherein each push-pull switch comprises a p-channel field-effect transistor and an n-channel field-effect transistor,
   wherein a source terminal of the p-channel field-effect transistor is connected to the LED supply voltage,
   wherein a drain terminal of the p-channel field-effect transistor is connected to a drain terminal of the n-channel field-effect transistor and to the line of the number n of first electrical lines,
   wherein a source terminal of the n-channel field-effect transistor is connected to the output voltage terminal of the adjustable voltage source, and
   wherein gate terminals of both field-effect transistors are connected in common to a control terminal of the push-pull switch.

4. The passive matrix LED display module according to claim 3, wherein the control terminals of the push-pull switches are connected to respective control outputs of a controller and a control terminal of the adjustable voltage source is connected to a further control terminal of the controller.

5. The passive matrix LED display module according to claim 4, wherein the number m of second electrical lines is connected to terminals of an LED driver which are connected to respective switching stages for applying a respective reference potential, wherein the controller is coupled to the LED driver via a data interface, and wherein the LED driver is configured to receive instructions from the controller for switching the switching stages.

6. The passive matrix LED display module according to claim 1, wherein at least one LED light source includes exactly one light-emitting diode.

7. The passive matrix LED display module according to claim 1, wherein at least one LED light source comprises a plurality of light-emitting diodes.

8. The passive matrix LED display module according to claim 1,
   wherein the adjustable voltage source comprises at least one operational amplifier, one npn transistor and one pnp transistor,
   wherein a positive voltage input of the operational amplifier is connected to a control input of the adjustable voltage source,
   wherein an output of the operational amplifier is connected to a base of the npn transistor and to a base of the pnp transistor,
   wherein emitters of the npn transistor and the pnp transistor are connected to an output voltage terminal as well as to a negative voltage input of the operational amplifier,
   wherein a collector of the npn transistor is connected to a first, higher supply voltage and
   wherein a collector of the pnp transistor is connected to a second, lower supply voltage.

9. The passive matrix LED display module according to claim 8, wherein an RC smoothing element is connected between the control input and the positive voltage input and a control signal received at the control input is a PWM signal.

10. A passive matrix LED display module arrangement comprising:
    a plurality of adjacent passive matrix LED display modules according to claim 1.

11. A passive matrix LED display module comprising:

a number n of first electrical lines connected to a respective first switch, where the number n>1;

a number m of second electrical lines connected to a respective second switch, where the number m>1; and at least m times n LED light sources, wherein each of the LED light sources is connected on an anode side to a line of the number n of first electrical lines and on a cathode side to a line of the number m of second electrical lines, wherein each of the first switches is a push-pull switch having a first terminal for connection to an LED supply voltage, a second terminal for connection to an adjustable discharge potential, a third terminal for receiving a switching signal and a fourth terminal for connection to the line of the number n of first electrical lines, wherein each of the second switches in a switched state is configured to allow current to flow to a reference potential, wherein the second terminals of the push-pull switches are connected in common to an output voltage terminal of an adjustable voltage source, wherein the adjustable voltage source comprises at least one operational amplifier, one npn transistor and one pnp transistor, wherein a positive voltage input of the operational amplifier is connected to a control input of the adjustable voltage source, wherein an output of the operational amplifier is connected to a base of the npn transistor and to a base of the pnp transistor, wherein emitters of the npn transistor and the pnp transistor are connected to the output voltage terminal as well as to a negative voltage input of the operational amplifier, wherein a collector of the npn transistor is connected to a first, higher supply voltage, and wherein a collector of the pnp transistor is connected to a second, lower supply voltage.

* * * * *